(12) United States Patent
Mandelman et al.

(10) Patent No.: US 6,642,566 B1
(45) Date of Patent: Nov. 4, 2003

(54) ASYMMETRIC INSIDE SPACER FOR VERTICAL TRANSISTOR

(75) Inventors: Jack A. Mandelman, Stormville, NY (US); Ramachandra Divakaruni, Ossining, NY (US); Haining Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/195,601

(22) Filed: Jun. 28, 2002

(51) Int. Cl.⁷ .................. H01L 27/08; H01L 29/76; H01L 29/94; H01L 31/119
(52) U.S. Cl. ...................... 257/302; 257/301
(58) Field of Search .................. 257/302, 301

(56) References Cited

U.S. PATENT DOCUMENTS 6,518,616 B2 * 2/2003 Dyer et al. .............. 257/301
6,552,382 B1 * 4/2003 Wu ........................ 257/305

* cited by examiner

*Primary Examiner*—Hoai Ho
*Assistant Examiner*—Tu-Tu Ho
(74) *Attorney, Agent, or Firm*—Eric W. Petraske; H. Daniel Schnurmann

(57) ABSTRACT

A DRAM array having a DRAM cell employing vertical transistors increases electrical reliability and reduces bitline capacitance by use of an asymmetric structure in the connection between the wordline and the transistor, thereby permitting the use of a wider connection between the wordline and the transistor electrode and using the wordline as an etch stop to protect the transistor gate during the patterning of the wordlines.

14 Claims, 10 Drawing Sheets

ASYMMETRIC INSIDE SPACER FOR VERTICAL TRANSISTOR

TECHNICAL FIELD

The field of the invention is that of DRAM arrays using vertical transistors.

BACKGROUND OF THE INVENTION

It is highly desirable to minimize bitline capacitance (Cbitline) in dynamic random access memories (DRAMs). The magnitude of the voltage stored on the storage capacitor (Vstorage) and signal voltage developed on the bitline conductor (Vsignal) during the data read operation is influenced by the ratio of the storage capacitance to the bitline capacitance. Referring to FIG. 1, the signal voltage is given by Vsignal=0.5*Vstorage*Cstorage/(Cbitline+Cstorage)

where Vstorage is the voltage difference between the stored high and low levels on storage capacitor 405, and Cbitline is the parasitic capacitance of the bitline including the input capacitance of the sense amplifier. To maximize the signal developed on the bitline, and to maximize the data retention time, the transfer ratio, Cstorage/(Cbitline+Cstorage), must be maximized.

Bitline capacitance slows the switching of the array transistor and reduces the signal developed on the bitline, making sensing (detection of data state) more difficult. A significant portion of the bitline capacitance is due to coupling between the bitline and crossing wordlines. This is particularly true for contemporary DRAM cells employing vertical MOSFETs for the array transistors.

In a well-known prior art array layout shown in plan view in FIG. 2, there are two bitline contacts associated with each storage capacitor 400 in the memory array. Deep trench storage capacitors and vertical MOSFETs lie under the intersection of wordlines 430 and bitlines 420. Contact 425 between bitline and MOSFET is made on each side of a wordline 430. Significant bitline capacitance is contributed at the points of intersection of a bitline with the orthogonally crossing wordlines. Although this layout has high bitline capacitance, it is particularly immune to variations in bitline to MOSFET contact resistance due to misalignment of the wordline with respect to the location of the vertical MOSFETgate/storage capacitor; while misalignment in one direction reduces the area of one contact, the area of the second contact is unaffected.

In order to reduce the bitline capacitance, an alternate prior art layout which employs a single bitline contact per cell (shown in FIG. 3) has been used. Although this design results in significantly reduced bitline capacitance, high resistance between bitline and array MOSFET may result from misalignment of the wordline in a manufacturing process. FIG. 3 shows misaligned wordlines 430', resulting in a rarrower contact 425'than in teh prior art of FIG. 2. The differenec is denoted by brackets 426 and 426'. High resistance between bitline and array MOSFET degrades performance.

In this prior art layout, a single bitline contact to MOSFET is used per cell to reduce bitline capacitance. However, as shown for the case of misaligned wordlines with respect to the vertical MOSFETs/storage capacitors, there may be a reduction in the contact area between bitlines and the transistor. This may lead to failure of the wordline to contact the gate conductor of the vertical MOSFET. The resulting high resistance degrades performance.

The problem is especially acute because of the dual inside spacers employed in the top portion of the storage trench, which are required to avoid exposure of the channel of the vertical MOSFET during the wordline etch process, and to eliminate shorting between the bitline contact and the gate conductor. in FIG. 5, two nitride spacers 134 leave only a small amount of poly to make contact between the wordline stack 302, 304 and gate 205 of the vertical transistor. Such a small amount of material provides a relatively high resistance in the current path of the cell and is susceptible to fluctuations in the manufacturing process. With a small amount of wordline misalignment, as may routinely occur in the manufacturing process, the wordline may fail to connect with the gate conductor. This would render the cell inoperative. A corresponding plan view is shown in FIG. 4, in which wordlines 432 are deliberately offset from the capacitor 400. The result is that bitline contacts 426 have the same dimension as those in FIG. 2 and are insensitive to misalignment.

SUMMARY OF THE INVENTION

The invention relates to a vertical MOSFET DRAM cell containing asymmetric inner spacers.

A feature of the invention is the use of a wordline displaced from the center of the DRAM cell.

Another feature of the invention is the use of the wordline as an etch stop to protect one side of the gate of the vertical MOSFET.

Yet another feature of the invention is the use of a single dielectric protective spacer on the side of the cell opposite the wordline.

Yet another feature of the invention is the provision of a wide gate extension contact between the gate of the vertical MOSFET and the wordline.

DETAILED DESCRIPTION

Figure 1:
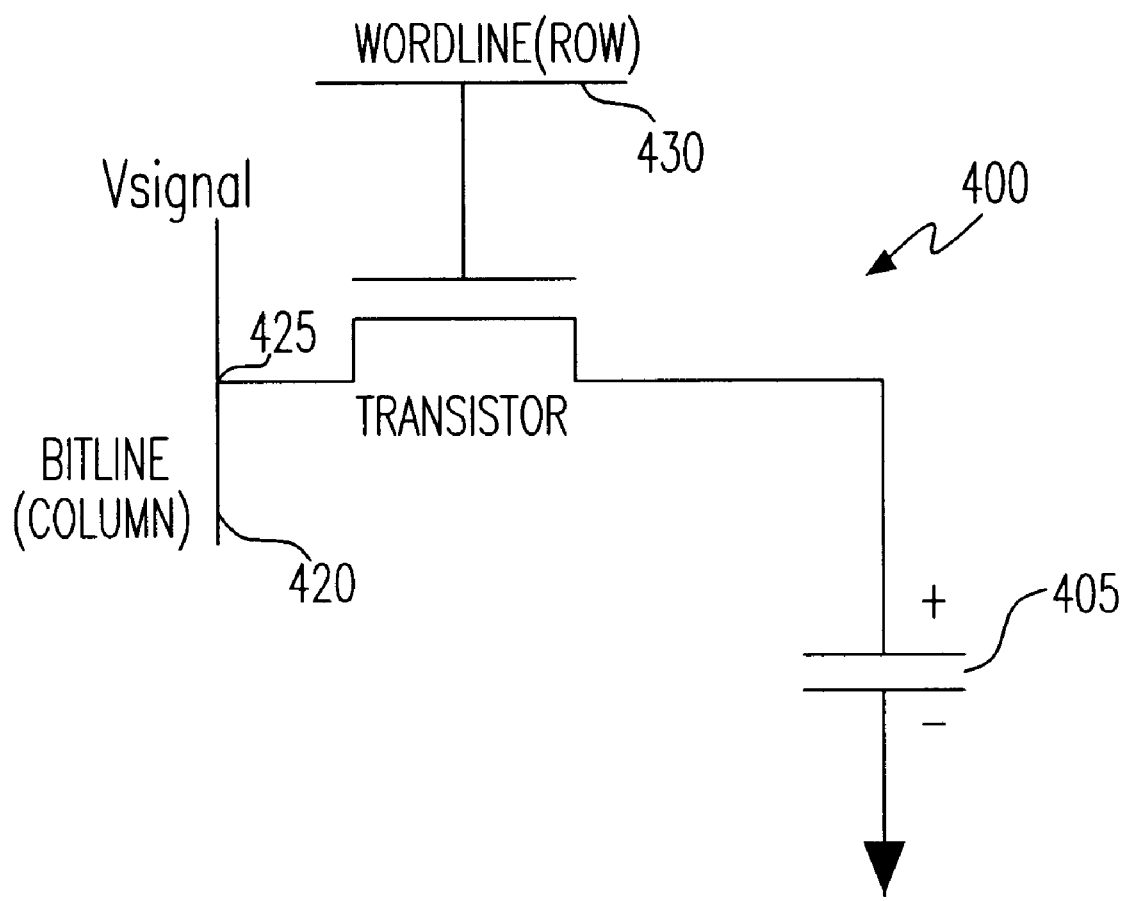
FIG. 1 shows schematically a DRAM cell.
Figure 2:
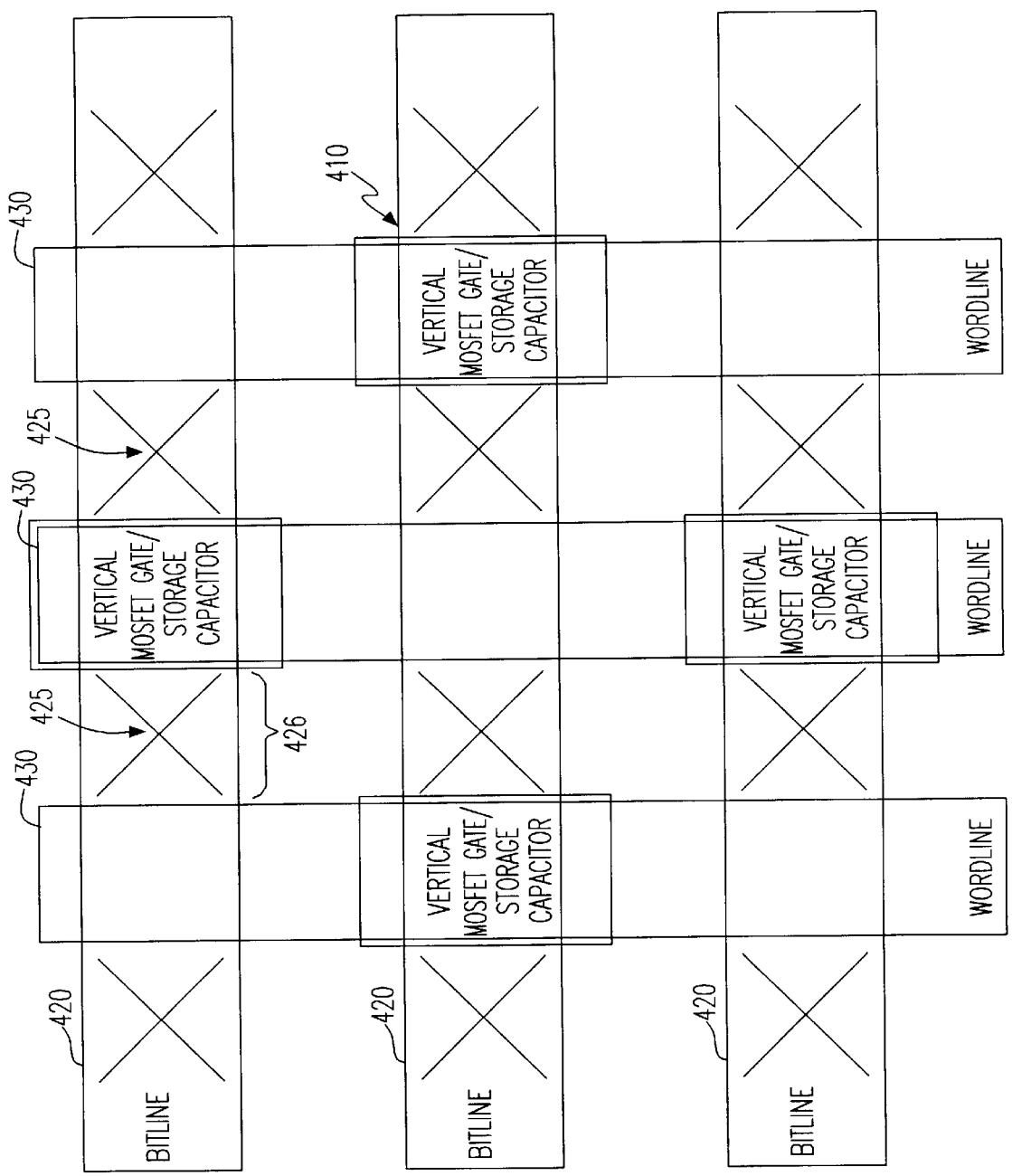
FIGS. 2 through 4 show plan views of prior art layout arrangements.
Figure 3:
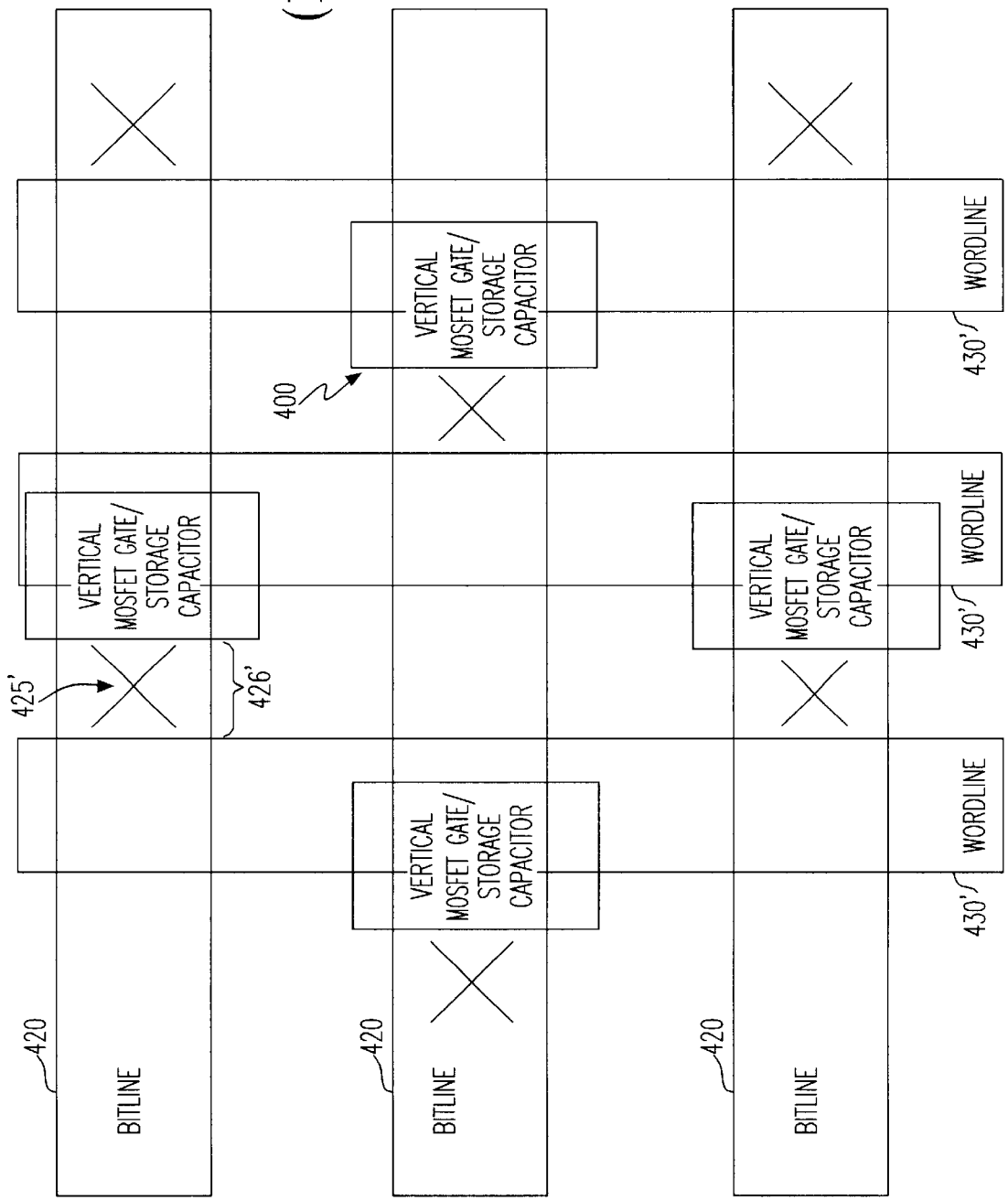
Figure 4:
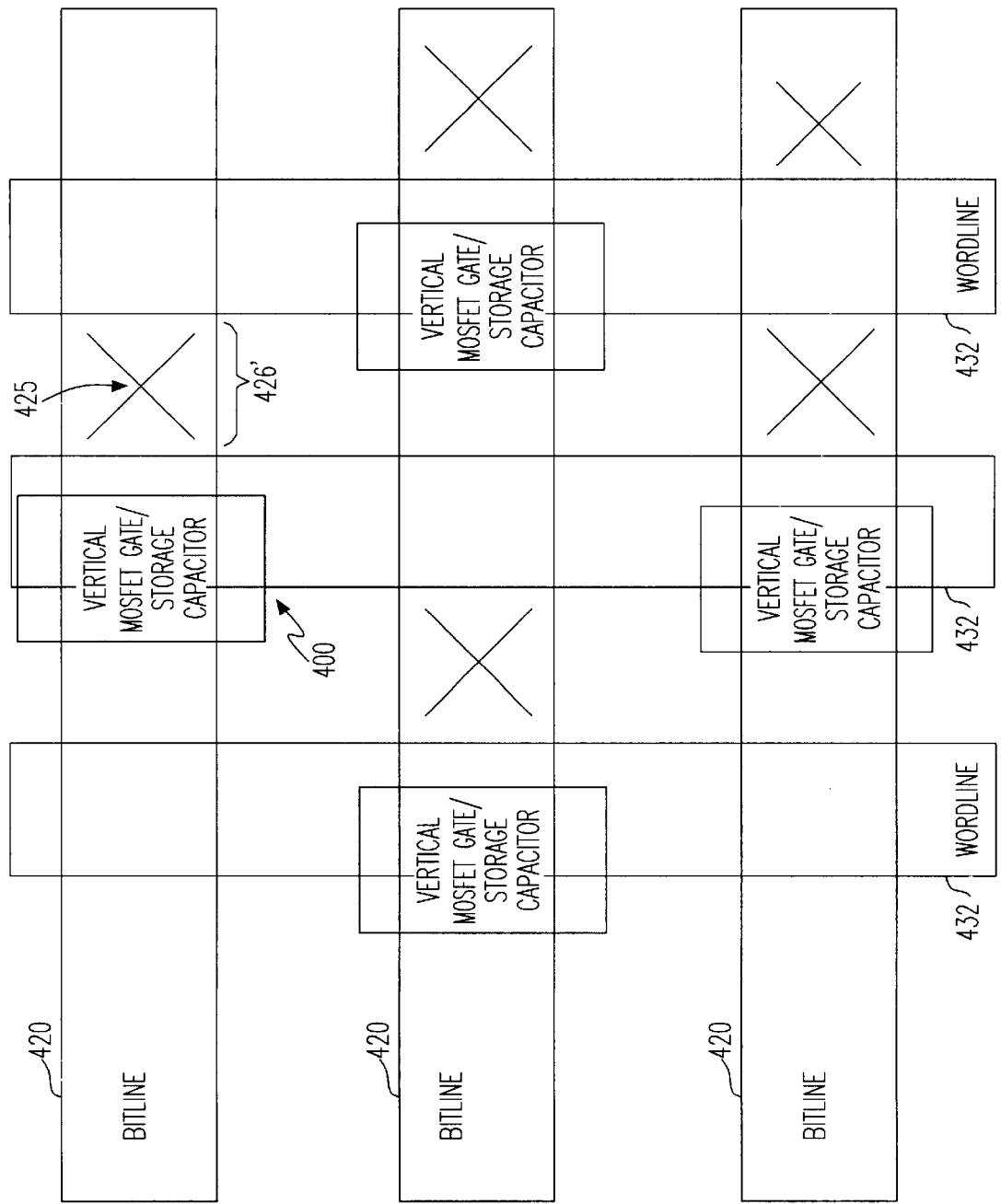
Figure 5:
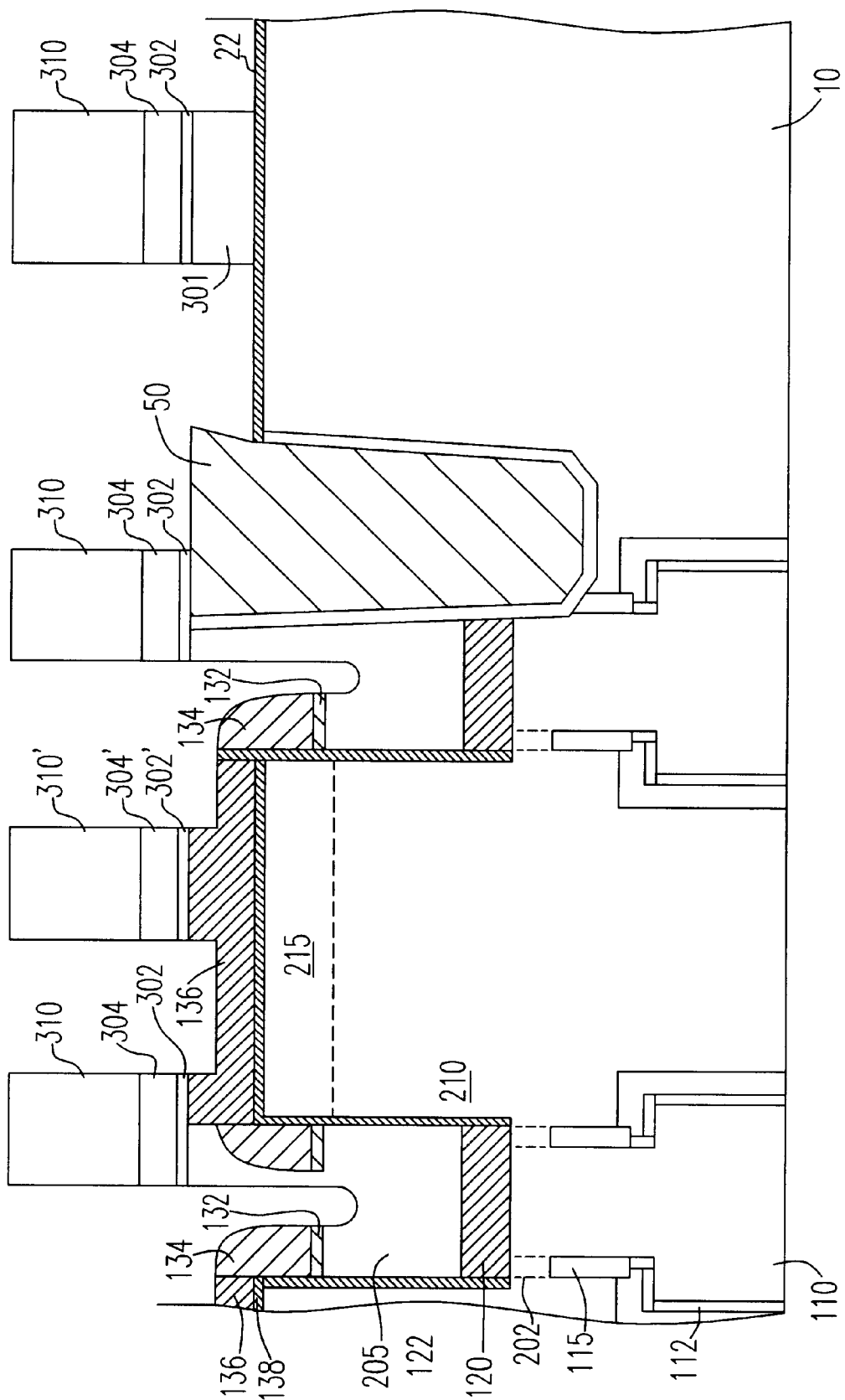
FIG. 5 shows a corresponding cross section of a prior art DRAM array.
Figure 6:
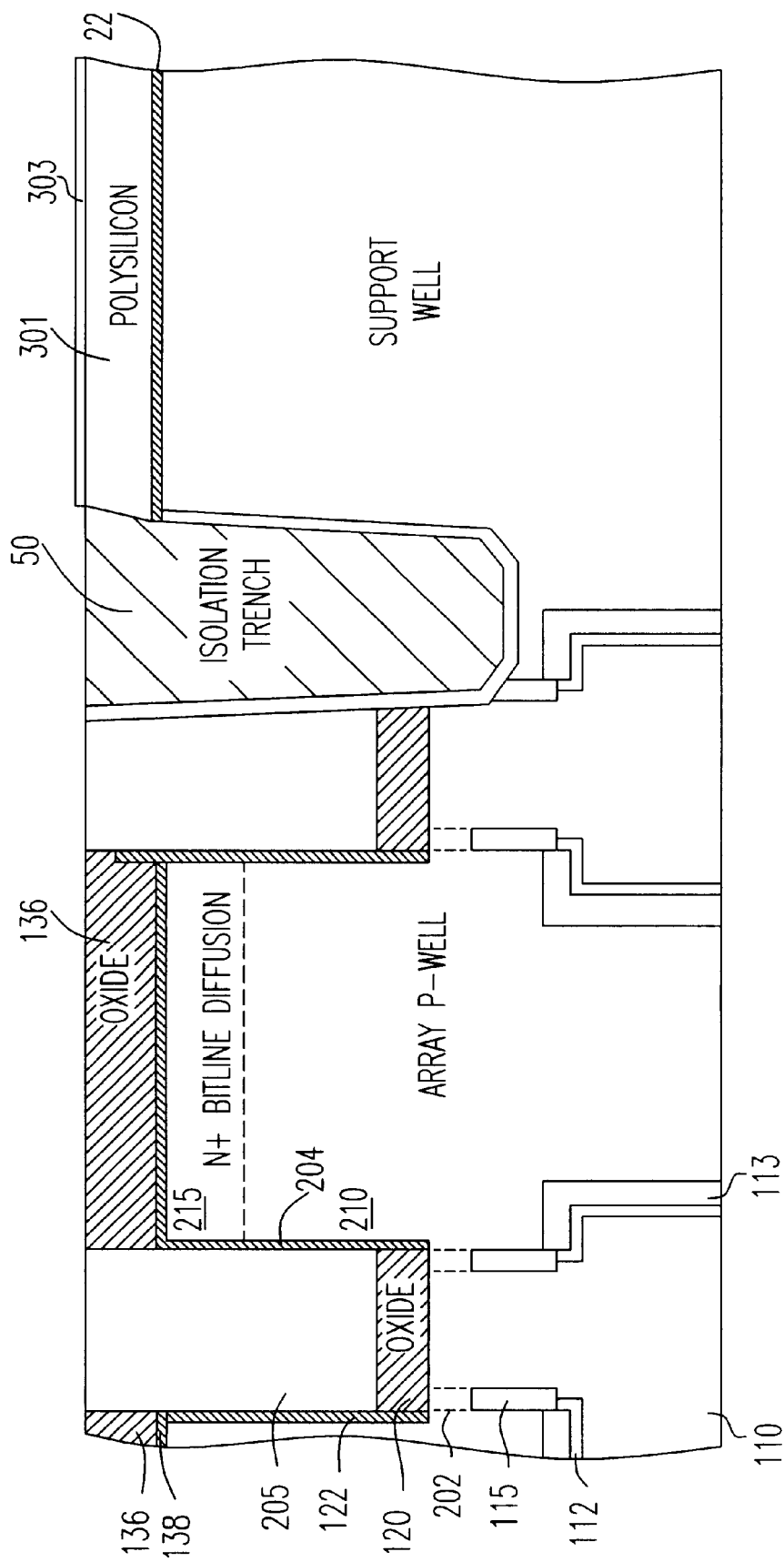
FIGS. 6 through 10 show in cross section a portion of a DRAM array according to the invention.

Referring to FIG. 6, there is shown a cross section of an integrated circuit showing the edge of a DRAM array containing two cells, separated from a support transistor by an isolation trench filled with dielectric 50 (oxide) after preparation steps. Vertical array MOSFETs have been formed above the capacitors at the left and center of the Figure. Standard, well known, processing for forming a vertical MOSFET DRAM array through the formation of the vertical gate conductor has been followed.

The processing to this point entails:
a) formation of trench storage capacitors comprising:
  etching of the deep storage trenches;
  diffusion of the counter-electrode 113 (buried-plate) of the storage capacitor by outdiffusion of N-type dopant through the sidewall of the lower portion of the deep trench;
  formation of the storage capacitor dielectric 112;
  formation of the collar isolation oxide 115;
  filling, planarizing, and recessing of the conductive material (preferably N+polysilicon) in the trench to form the center electrode 110 of the capacitor;

formation of a conductive buried strap 202 between the node electrode 110 and a portion of the sidewall of the storage trench;

formation of an insulating layer 120 (trench top oxide, or TTO) over the recessed conductive material in the trench;

b) formation of the vertical MOSFET in the upper portion of the trench, above the trench storage capacitor described above, comprising:

formation of a vertical gate insulating layer 204;

depositing and planarizing the gate conductor material 205 (preferably N+polysilicon) for the vertical MOSFET;

implantation of the N+bitline diffusion 215 and the P-well doping in the array; and implantation of an N-type buried layer to provide isolation between the array P-well and the substrate.

At this point in the process, isolation trenches 50 are etched, filled with oxide, and planarized, using methods that are well known to one skilled in the art.

The array is then protected by a silicon nitride layer, while the support regions are processed. This entails removal of the thick oxide (array top oxide) from the supports;

formation of a sacrificial oxide over the surface of the substrate in the support regions;

implantation of the support well (P-well and N-well) doping; stripping the sacrificial oxide;

formation of the support MOSFET gate oxide 22;

deposition and planarization of a first gate poly layer 301 for the supports;

oxidizing the top surface of layer 301 to provide an etch stop 303; and removal of the protective nitride layer from the array.

The result of these well known standard processing steps, is shown in FIG. 6, with a cross-section of a silicon substrate following formation of trench storage capacitors having center electrode 110, capacitor dielectric 112 and outdiffusion (plate) 113. Collar oxide 115 isolates center electrode 110 from the substrate. Buried strap 202 is the lower terminal or electrode of the transistor (sometimes referred to as a source/drain diffusion), having polysilicon gate 205 deposited in the upper portion of the trench and separated vertically from electrode 110 by trench top oxide 120. Transistor body 210 is separated from gate 205 by gate dielectric (oxide/nitride) 138 (204). Bitline source/drain diffusion 215 (extending horizontally from the transistor on the left to the one on the right) forms the upper terminal or electrode of the cell transistor. For purposes of the claims, the steps of etching the deep trench, doping the buried plate 113, forming capacitor dielectric 112 and center electrode 110 will be referred to as forming a trench capacitor. The steps of doping buried strap 202, gate dielectric 204, gate 205 and upper diffusion 215 will be referred to as forming a vertical transistor.

Additional processing includes forming dielectric 22 that will be the gate dielectric for the support transistors, depositing poly 301 that will form the gates of the support transistors and forming thick oxide 136 that will separate the vertical transistors from the bitline (interconnect member) contact that will be connected to diffusion 215. These steps entail processes which are well known to one skilled in the art.

Figure 7:
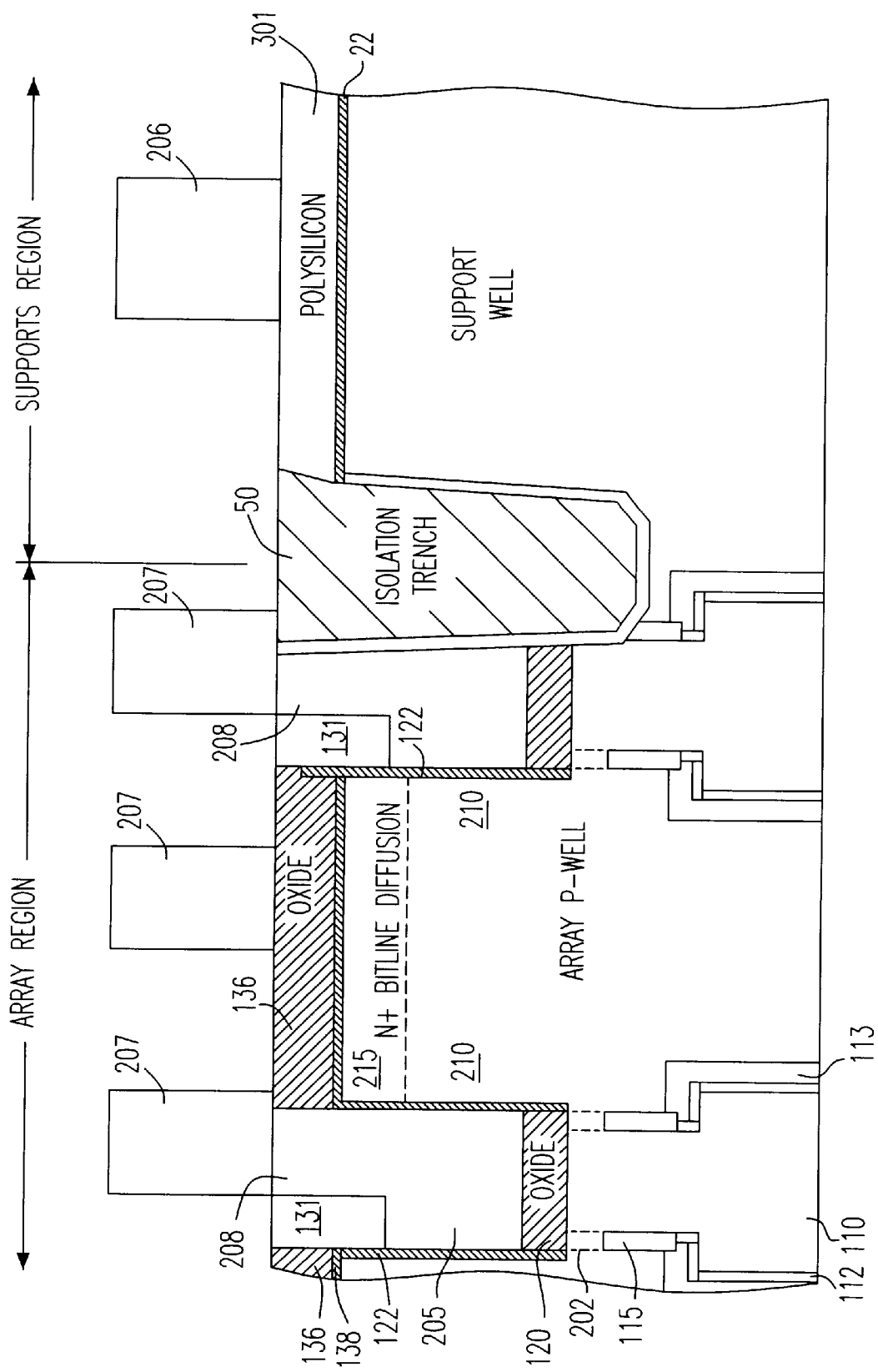

Referring now to FIG. 7, there is shown the result of further steps comprising the application of a layer of photoresist 207, and patterning the resist with the gate conductor/wordline mask (gate conductors 206' in the support area and wordlines 207' in the array), preferably using 193 nm irradiation. Following resist patterning, the exposed portion of the planarized array MOSFET gate conductor polysilicon 205 is recessed to a depth that is above the N+bitline diffusion to array P-well junction at the bottom of upper electrode 215, (preferably to a depth of 25–75 nm below the surface of the substrate, and more preferably to a depth of 50 nm). It is important that the N+bitline diffusion to array P-well junction not be exposed. The photoresist protects a first side of the gate conductor while the aperture is opened on a second side of the gate conductor opposite the first side. During the etch process, the support poly 301 is protected by the previously formed oxide layer 303. The photoresist is then stripped.

Next, a silicon nitride layer 134 is deposited, filling the apertures in the vertical gate conductor 205 that had been etched previously. A thin oxide liner 132 may optionally be formed prior to the deposition of the nitride layer. The oxide liner serves as an etch stop layer during subsequent etching of the nitride, thus preventing the subsequent nitride etch from damaging the underlying gate polysilicon material.

Figure 8:
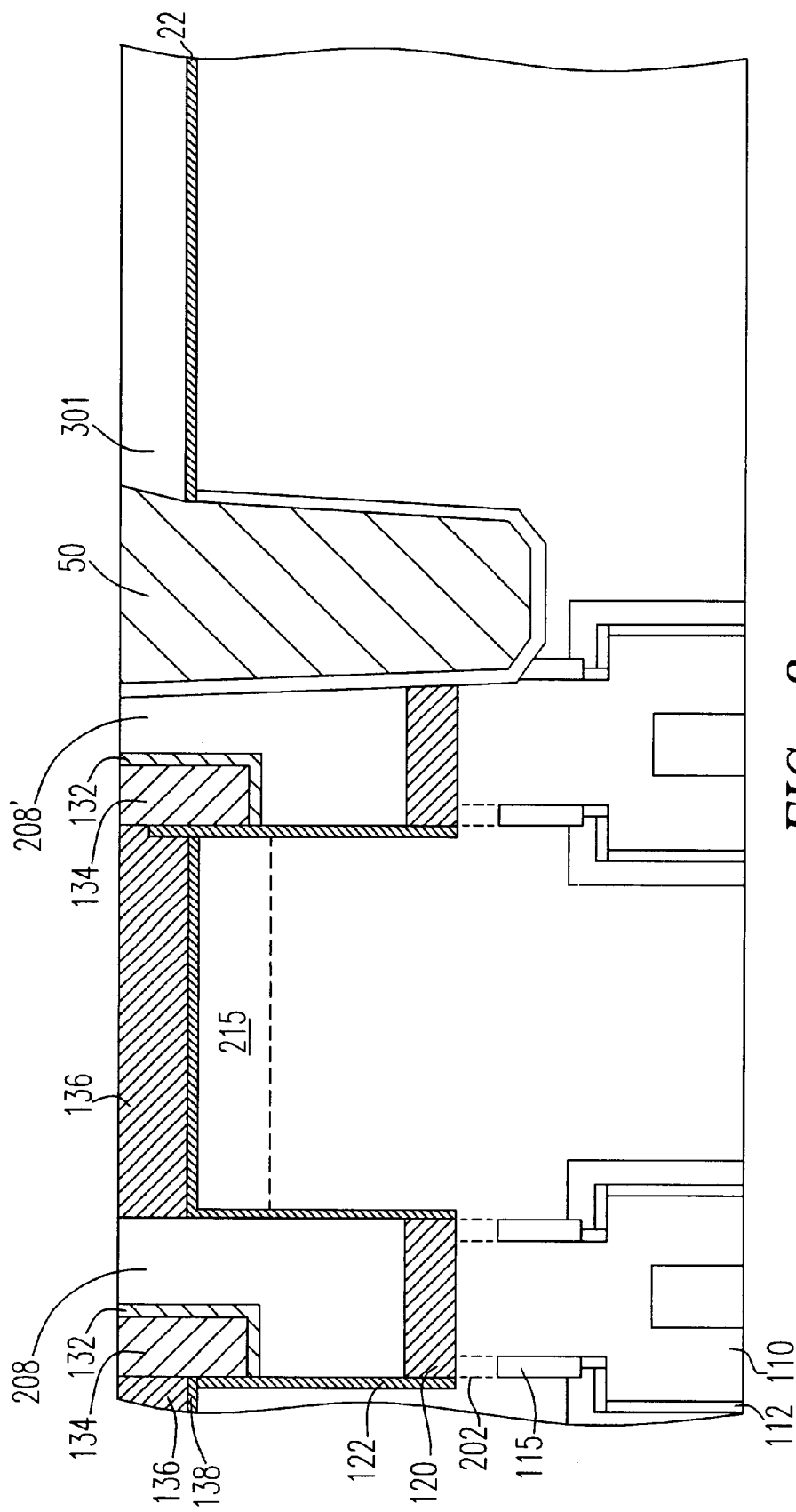

As shown in FIG. 8, the nitride layer is etched back, leaving the apertures in the gate conductor of the vertical MOSFET filled with a dielectric plug of silicon nitride. The etch back of the silicon nitride can be achieved using any one or combination of well known methods, such as anisotropic or wet or dry isotropic etching of silicon nitride selective to silicon oxide and silicon, or by chemical mechanical polishing (CMP). Any oxide layer underlying the silicon nitride layer serves to enhance the etch selectivity with respect to silicon (or polysilicon) and is subsequently removed with an additional etch.

Figure 9:
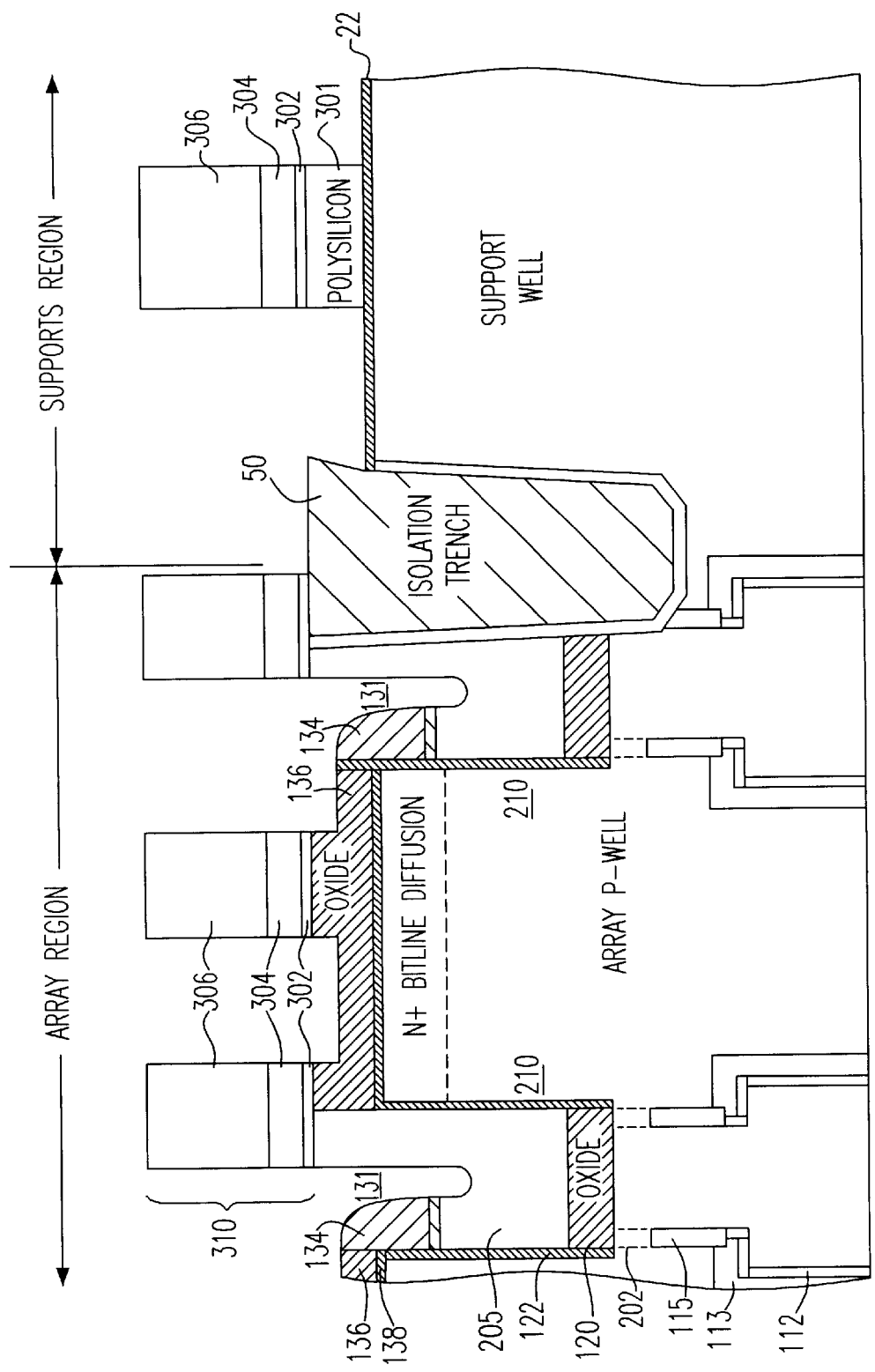

Following the planarization step described above, wordline/gate conductor stack material 310 is deposited in electrical contact with the top portion of array gate poly 205 (referred to as a gate connection member). The wordline gate conductor stack consists of a thin (~10–30 nm) layer of polysilicon 302, followed by a 50–100 nm thick tungsten layer 304 (to provide low-resistance for the wordline), followed by a protective thick silicon nitride layer 306 (100 nm–250 nm). The top silicon nitride layer is required for the subsequent formation of the bitline contact borderless to the wordline. Wordline (conductive) stack material 310 is then patterned using the shifted gate conductor (GC) mask according to the invention, forming wordlines (referred to as gate control members in the claims). An anisotropic etch is used to etch through the wordline stack material. The etch continues through the polysilicon layer in the supports region to pattern the gate conductors for the supports MOSFETs. A byproduct of the continued etching through the polysilicon in the supports is that the inevitable misalignment of the wordline causes an additional aperture 131 to be formed in the gate conductor poly 205 of the vertical array MOSFET. However, since the second side of the gate conductor for the vertical array MOSFET, outside the wordline, is protected by the previously formed silicon nitride region, control of overetch of the supports polysilicon layer is not a critical issue. Furthermore, the inventive structure using an asymmetric protective spacer provides much greater contact area between the wordline conductor 310 and the underlying polysilicon 205 of the vertical MOSFET gate conductor. Thus, contact between the wordline conductor and the underlying polysilicon of the vertical MOSFET is assured even for worst case misalignment of the wordline. The resulting structure is shown in FIG. 9.

Figure 10:
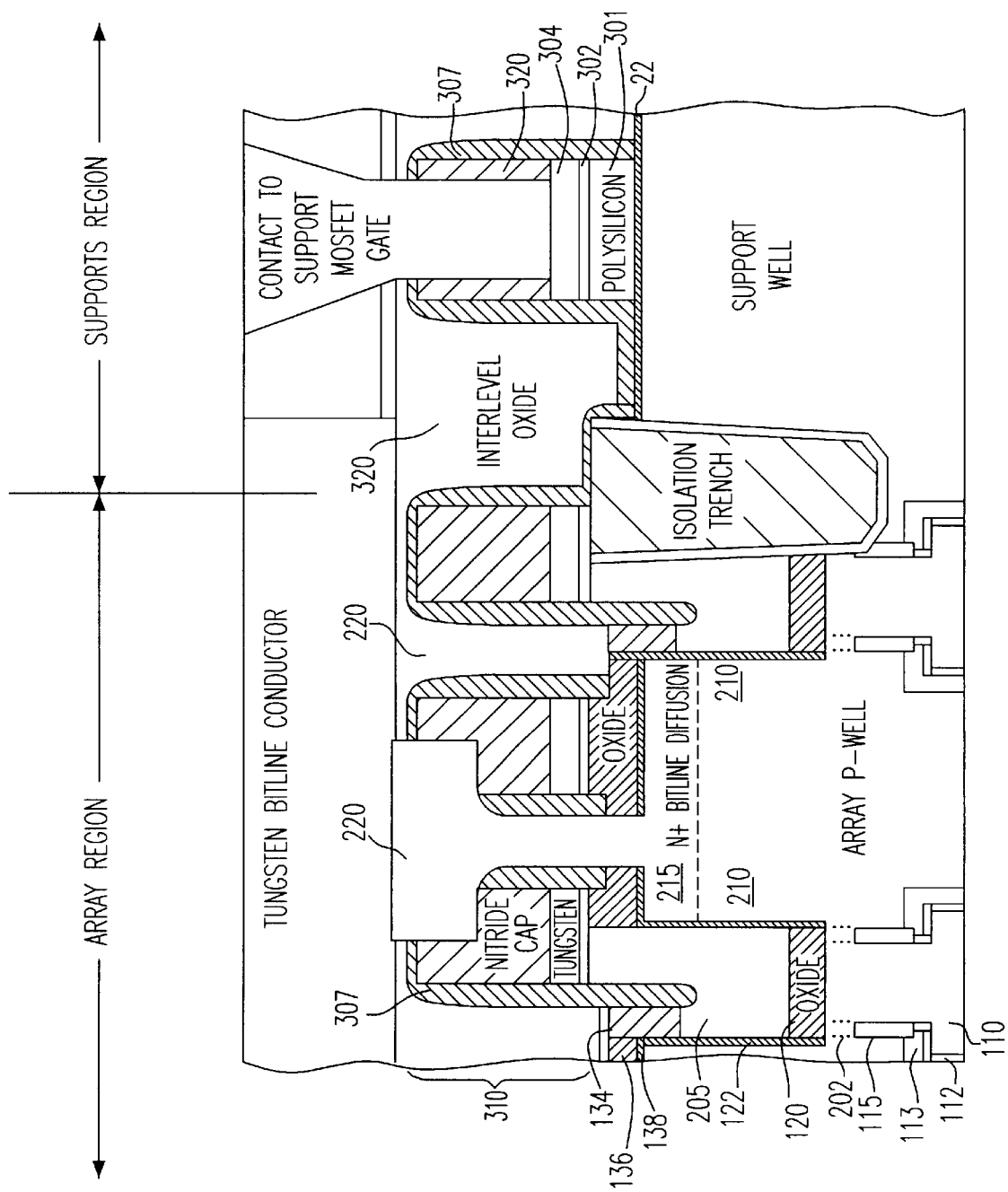

Protective silicon nitride spacers 307 are formed on the sidewalls of the wordlines/gate conductor stacks 310 by well known deposition and anisotropic etching techniques. Not only does the spacer on the left of wordlines 310 provide insulation from the adjacent bitline contact, they also fill apertures 131 when they are present, thus protecting that edge of gate 205. BPSG 320 (borophosphosilicate glass), or other suitable reflowable dielectric is deposited and planarized to fill the gaps between wordlines/gate conductors. Bitline contacts are then formed borderless to the wordlines in the interconnect member contact areas on bitline diffusions 215. Then tungsten metallurgy (known as the M0 level) is deposited and patterned, typically by a damascene method, to form the bitline conductors and conductive contacts to the gates of the supports MOSFETs (FIG. 10). Additional layers of interlevel dielectric, vias, and metal wiring levels are formed as needed to complete the product.

While the invention has been described in terms of a single preferred embodiment, those skilled in the art will recognize that the invention can be practiced in various versions within the spirit and scope of the following claims.

What is claimed is:

1. A DRAM cell comprising:
   a trench capacitor embedded in a semiconductor substrate, said capacitor having a center electrode, a buried strap connected between said center electrode and a lower transistor electrode;
   a vertical transistor disposed above said center electrode and connected thereto by said lower electrode, having an upper electrode connected to an interconnect member and having a gate disposed above said center electrode and connected to a control member by a gate connection member disposed above said gate and below said control member, said gate of said vertical transistor being isolated from said substrate by a transistor gate insulation layer disposed laterally about said gate, in which said gate connection member is isolated from said substrate by said gate insulation layer on a first side thereof and by a dielectric spacer on a second side thereof opposite said first side, whereby the width of said gate connection member is not reduced by a dielectric spacer on said first side.

2. A cell according to claim 1, in which said gate and said gate connection member are formed from polysilicon deposited above said trench capacitor.

3. A cell according to claim 1, in which said dielectric spacer is formed from nitride.

4. A cell according to claim 3, further comprising a nitride sidewall spacer formed on a side of said control member adjacent to said dielectric spacer.

5. A cell according to claim 1, in which said upper electrode is a doped area of said substrate formed by diffusion of dopant into said substrate.

6. A method of forming a DRAM cell comprising the steps of:
   a) forming a trench capacitor embedded in a semiconductor substrate by etching a trench in said substrate;
   forming a capacitor dielectric on an interior surface of said trench;
   forming a center electrode within a lower portion of said trench;
   b) forming a vertical transistor disposed above said center electrode and connected thereto by a lower transistor electrode, said vertical transistor having a gate formed from a conductive gate material and disposed within said trench above said center electrode and separated from said substrate by a gate insulation layer on a first side thereof and having an upper electrode disposed outside said trench and having an interconnect member contact area;
   c) depositing a mask layer above said substrate and patterning said mask layer to form a gate connection member from a portion of said conductive gate material on a first side thereof, thereby etching an aperture into said layer of conductive gate material on a second side of said gate opposite said first side and outside said gate connection member;
   d) filling said aperture with a dielectric to form a dielectric plug in said aperture and planarizing said dielectric outside said aperture; and
   e) depositing a conductive stack layer and patterning said conductive stack layer to form a gate control member in electrical contact with said gate connection member and displaced from said interconnect member contact area on said first side and from said dielectric plug on said second side, whereby said gate conductive material is protected by said gate control member and by said dielectric plug while patterning said conductive stack layer.

7. A method according to claim 6, further comprising a step of forming a dielectric sidewall on said control member adjacent to said dielectric spacer.

8. A method according to claim 6, in which said conductive gate material is silicon and said dielectric is nitride.

9. A method according to claim 7, in which said conductive gate material is silicon and said dielectric is nitride.

10. A method of forming an integrated circuit containing an array of DRAM cells and support transistors comprising the steps of:
   a) forming an array of trench capacitors embedded in a semiconductor substrate by etching an array of trenches in said substrate, forming capacitor dielectrics on an interior surface of said trenches, and forming center electrodes within a lower portion of said trenches;
   b) forming a vertical transistor disposed above said center electrode and connected thereto by a lower transistor electrode, said vertical transistor having a gate formed from a conductive gate material and disposed within said trench and separated from said substrate by a gate insulation layer on a first side thereof, disposed above said center electrode and having an upper electrode disposed outside said trench and having an interconnect member contact area;
   c) forming a layer of gate oxide on a surface of said substrate and depositing a layer of polysilicon on said gate oxide;
   d) depositing a mask layer above said substrate and patterning said mask layer to form a set of gate connection members from a portion of said gate conductive material on a first side thereof, thereby etching an aperture into said layer of conductive gate material on a second side of said gates opposite said first side and outside said portion of said gate conductive material;
   e) filling said apertures with a dielectric to form dielectric plugs in said aperture and planarizing said dielectric outside said aperture;
   f) depositing a conductive stack layer and patterning said conductive stack layer to form simultaneously a set of support transistor gates outside said array and a set of gate control members in electrical contact with said gate connection members and displaced from said interconnect member contact areas on said first side and from said dielectric plugs on said second side, whereby said gate conductive material is protected by said gate control members and by said dielectric plugs while patterning said conductive stack layer;

g) forming a set of insulating sidewalls on said set of gate control members; and h) forming a set of interconnect members in electrical contact with said set of interconnect member contact areas.

11. A method according to claim 10, in which said step of patterning said control member is carried out simultaneously with a step of patterning transistor gates of said support transistors, whereby overetching of said transistor gates forms divots in said conductive gate material between said gate connection members and said dielectric spacers.

12. A method according to claim 11, further comprising a step of forming a dielectric sidewall on said control member adjacent to said dielectric spacer, thereby filling said divots.

13. A method according to claim 10, in which said conductive gate material is silicon and said dielectric is nitride.

14. A method according to claim 11, in which said conductive gate material is silicon and said dielectric is nitride.

* * * * *